(12) United States Patent
Kalpat et al.

(10) Patent No.: US 7,235,502 B2
(45) Date of Patent: Jun. 26, 2007

(54) TRANSITIONAL DIELECTRIC LAYER TO IMPROVE RELIABILITY AND PERFORMANCE OF HIGH DIELECTRIC CONSTANT TRANSISTORS

(75) Inventors: Sriram S. Kalpat, Austin, TX (US); Voon-Yew Thean, Austin, TX (US); Hsing H. Tseng, Austin, TX (US); Olubunmi O. Adetutu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 55 days.

(21) Appl. No.: 11/096,515

(22) Filed: Mar. 31, 2005

(65) Prior Publication Data

US 2006/0220157 A1 Oct. 5, 2006

(51) Int. Cl.
*H01L 21/31* (2006.01)
(52) U.S. Cl. .............. 438/785; 438/786; 438/769; 438/240; 257/E21.28; 257/E21.278
(58) Field of Classification Search .......... 438/785, 438/786, 769, 240
See application file for complete search history.

(56) References Cited

U.S. PATENT DOCUMENTS

2005/0233156 A1* 10/2005 Senzaki et al. ............ 428/446
2006/0009044 A1*  1/2006 Igeta et al. ................ 438/778

* cited by examiner

*Primary Examiner*—Thanh Nguyen
(74) *Attorney, Agent, or Firm*—Kim-Marie Vo

(57) ABSTRACT

A gate dielectric structure (201) fabrication process includes forming a transitional dielectric film (205) overlying a silicon oxide film (204). A high dielectric constant film (206) is then formed overlying an upper surface of the transitional dielectric film (205). The composition of the transitional dielectric film (205) at the silicon oxide film (204) interface primarily comprises silicon and oxygen. The high K dielectric (206) and the composition of the transitional dielectric film (205) near the upper surface primarily comprise a metal element and oxygen. Forming the transitional dielectric film (205) may include forming a plurality of transitional dielectric layers (207) where the composition of each successive transitional dielectric layer (207) has a higher concentration of the metal element and a lower concentration of silicon. Forming the transitional dielectric layer (205) may include performing multiple cycles of an atomic layer deposition process (500) where a precursor concentration for each cycle differs from the precursor concentration of the preceding cycle.

12 Claims, 2 Drawing Sheets

TRANSITIONAL DIELECTRIC LAYER TO IMPROVE RELIABILITY AND PERFORMANCE OF HIGH DIELECTRIC CONSTANT TRANSISTORS

FIELD OF THE INVENTION

The invention is in the field of semiconductor fabrication processes and, more particularly, fabrication processes that use high dielectric constant gate dielectrics.

RELATED ART

The use of dielectric materials having high dielectric constants (also referred to as high K materials) is well known. High K dielectrics are used to address reliability problems resulting from the use of very thin gate dielectrics. Historically, thermally formed silicon dioxide was the preferred material for the gate dielectric of an MOS (metal oxide semiconductor) transistor.

While silicon oxide is well understood and has many desirable properties as a gate dielectric material, the dielectric constant of silicon dioxide is relatively low. Accordingly, achieving sufficient gate capacitance in transistor that have a small area (W×L) requires a thin silicon dioxide film. (Capacitance is proportional to area and inversely proportional to the dielectric thickness). As the area of transistors is scaled smaller and smaller, the thickness of a silicon dioxide that would be required to achieve the desired capacitance is undesirably thin. Extremely thin dielectric films present reliability problems when subjected to the large electric fields often associated with small channel transistors.

High K materials address this problem by enabling the fabrication of a transistor having a dielectic film with a specified equivalent oxide thickness (EOT) using a film that is sufficiently thick to withstand high field breakdown, leakage, and other phenomena associated with thin films. Unfortunately, high K films, when formed overlying a silicon substrate inevitably form a thin silicon-oxide layer between the high K material and the substrate. Due to differences in dielectric constant between the silicon-oxide film and the overlying high K material, the electric field applied across the gate dielectric exhibits a disproportionate drop across the two films. Specifically, the electric field within the silicon oxide film is greater than the field within the high K film.

This electric field discrepancy is theorized to result in the formation of excessive border states at the interface between the two dielectrics that presents a serious reliability issue. In addition, the presence of at least some high K films in close proximity to the transistor channel in the underlying substrate channel is theorized to degrade transistor performance by reducing carrier mobility. It would be desirable, therefore, to implement a fabrication process that accommodated the use of high K materials without introducing reliability and performance problems for the resulting transistor.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the present invention encompasses a semiconductor fabrication method and a transistor gate dielectric structure in which a transitional dielectric film is formed between a semiconductor substrate and a high K dielectric or between a residual oxide film that lies on the substrate and the high K dielectric. The transitional dielectric film preferably includes a plurality of individual layers in which the composition of a layer differs from the composition of its adjacent layers. In the preferred implementation of the transitional dielectric film, the composition of the layers nearer to the residual oxide film interface resembles the composition of the residual oxide film and the composition of the layers nearer to the high K dielectric resembles the composition of the high K dielectric. For example, in an implementation using a $HfO_2$ high K dielectric, the transitional layers at the residual oxide film, which includes silicon and oxygen, are primarily silicon and oxygen with a relatively small concentration of hafnium while the transitional layers at the high K dielectric interface are primarily hafnium and oxygen with a relatively small concentration of silicon. The composition of each subsequently formed transitional layer has an increased concentration of hafnium and a decreased concentration of silicon.

The transitional dielectric layer provides two important benefits. First, by "smoothing" the electric field gradient, the transitional dielectric layer beneficially improves reliability by reducing the occurrence of states at the dielectric interface. Second, the presence of the transitional dielectric film physically displaces the high-K dielectric film from the channel region of the semiconductor substrate resulting in reduce carrier mobility degradation (i.e., better carrier mobility).

Figure 1:
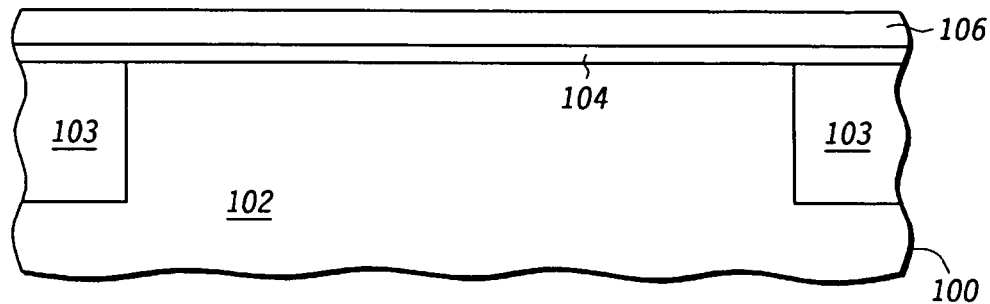
FIG. 1 is a partial cross sectional view of a wafer illustrating a high K dielectric implementation according to the prior art.

Referring now to the drawings, FIG. 1 depicts a semiconductor wafer 100 suitable for use in a semiconductor fabrication process. Wafer 100 is shown at a stage in the fabrication process following the formation of a gate dielectric film according to the prior art. At the depicted stage in the fabrication process, wafer 100 includes isolation structures 103 formed in a semiconductor substrate 102. Isolation structures 103 are typically silicon oxide shallow trench or local oxidation isolation structures well known in the field.

Wafer 100 includes a high K dielectric film (high K film) 106 overlying a semiconductor substrate 102. A residual dielectric film 104 (also referred to herein as interfacial dielectric film 104) is located between substrate 102 and high K film 106. In a typical implementation, high K film is a metal-oxide dielectric and residual oxide film 104 is a silicon oxide containing film. (Note that the term silicon oxide as used herein includes stoichiometric $SiO_2$ as well as non-stoichiometric silicon oxide compositions).

As indicated above, formation of high K film 106 invariably results in the formation of the residual silicon oxide film 104. The presence of high K film 106 directly on top of residual oxide film 104 is believed to result in a proliferation of border/interface states at the interface between the two films when a potential is applied across the composite structure. The presence of these states degrades the reliability of the dielectric structure. In addition, under normal operating voltages, the electric field across residual silicon oxide film 104 begins to exceed 10 MV/cm for structures having an equivalent oxide thickness of approximately 20 angstroms (2 nm) or less. It is generally undesirable from a reliability perspective to stress a silicon oxide film at greater than approximately 10 MV/cm.

The present invention address the interface/border state problem and the excessive electric field problem by introducing a transitional film, sometimes referred to as an interface film, between the residual oxide and the high K dielectric. In the preferred embodiment, the transitional film has a graded composition in which the composition of the transitional film proximal to the residual oxide film has a relatively low concentration of the metal (or other element) used in the high K dielectric while the composition proximal to the high K dielectric has a relatively high concentration of the metal in the high K dielectric. In other words, the composition of the transitional film is close to silicon oxide at the silicon oxide interface and close to MO (where M is the metal element in the high K) at the high K interface.

Figure 2:
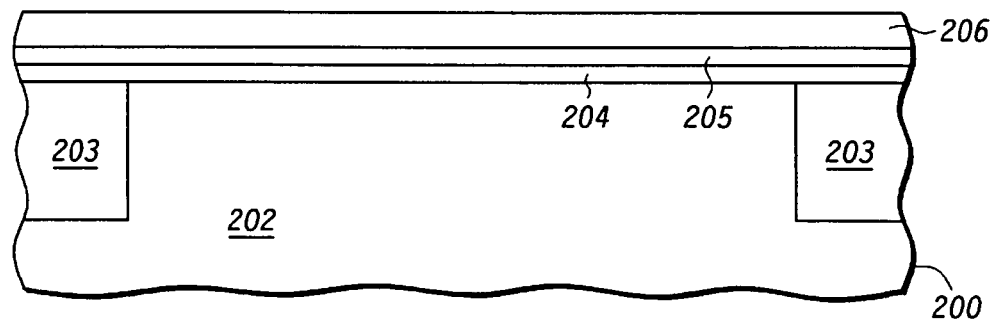
FIG. 2 is a partial cross sectional view of a wafer illustrating a high K dielectric implementation emphasizing the use of a transitional dielectric layer between the high K dielectric layer and the residual silicon oxide layer according to one embodiment of the invention.
Figure 3:
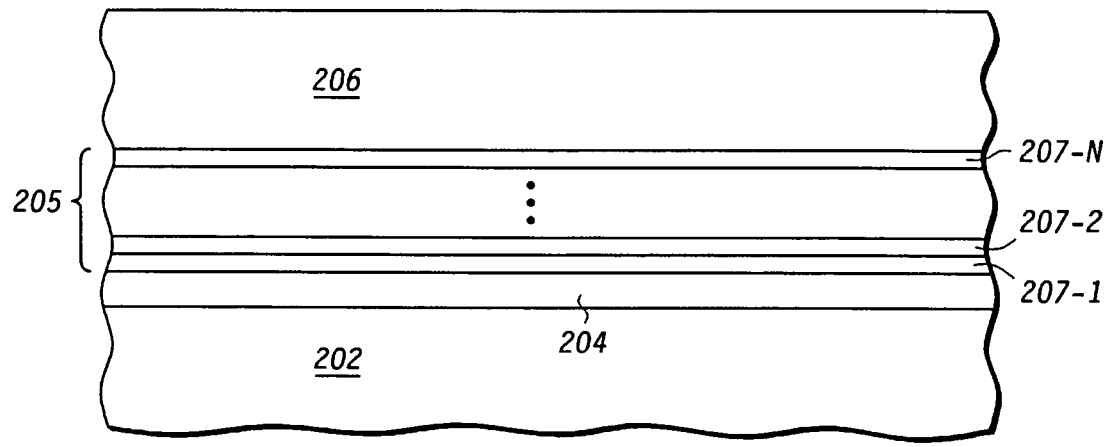
FIG. 3 is a partial cross sectional view of the wafer of FIG. 2 showing additional detail of the transitional dielectric layer according to an embodiment of the present invention.

FIG. 2 and FIG. 3 are two representations of the a gate dielectric structure 201 according to an embodiment of the present invention. As depicted in FIG. 2, gate dielectric structure 201 includes a residual oxide film 204 overlying a semiconductor substrate 202, a transitional dielectric film 205, and a high K dielectric 206. Isolation dielectric structures 203 have been formed in substrate 202. Substrate 202 is preferably a single-crystal silicon substrate that may be doped with n-type or p-type impurities or both. Substrate 202 may be part of a silicon-on-insulator (SOI) wafer in which substrate 202 overlies a buried oxide (BOX) layer and a semiconductor bulk layer (not shown). In addition, substrate 202 may be any semiconductor material or combination of semiconductor materials, such as gallum arsenide or germanium. The depicted portions of substrate 202 may represent an NWELL region of substrate 202 over which PMOS transistors are formed or a PWELL region of substrate 202 over which NMOS transistors are formed.

In one embodiment, residual oxide film 204 has a thickness of less than approximately 10 Angstroms (1 nm), transitional dielectric film 205 has a thickness in the range of 10 to 20 Angstroms (1 to 2 nm), and high K dielectric 206 has a thickness in the range of approximately 20 to 100 Angstroms (2 to 10 nm). In the preferred embodiment, the overall EOT of gate dielectric structure 201 is less than approximately 25 Angstroms (2.5 nm). As indicated previously, residual oxide film 204 is most likely a silicon oxide compound. High K dielectric 206 is preferably a metal oxide compound or a metal oxynitride compound. The metal element in this embodiment of high K dielectric may be any suitable metal element including hafnium, aluminum, tantalum, zirconium, and yttrium. In a hafnium embodiment, high K dielectric is preferably $HfO_2$. A dielectric constant of high K dielectric 206 is preferably in excess of approximately 20 (i.e., at least 5 times the dielectric constant of $SiO_2$).

FIG. 3 depicts additional detail of an implementation of transitional dielectric film 205. In the depicted implementation, transitional dielectric film 205 includes multiple dielectric layers 207-1 through 207-N (generically or collectively referred to as transitional dielectric layer(s) 207). In this embodiment, the composition of each transitional dielectric layer 207 differs, albeit possibly only slightly, from the composition of its adjacent layers. The composition of transitional dielectric layers 207 in proximity to residual oxide film 204 (layer 207-1 for example) preferably includes primarily a semiconductor element such as silicon and oxygen or a semiconductor element such as silicon, oxygen, and nitrogen and a relatively small or zero concentration of a metal element. In contrast, the composition of dielectric layers 207 in proximity to high K dielectric 206 (layer 207-N for example) preferably includes primarily the metal element and oxygen or the metal element, oxygen, and nitrogen, and a relatively small or zero concentration of the semiconductor element. If high K dielectric 206 is $HfO_2$, for example, the composition of dielectric layer 207-N is primarily hafnium and oxygen.

The composition of transitional dielectric film 205 may be described quasi-formulaically. In one embodiment, each transition dielectric layer 207 has a composition of $M_X Si_Y O_Z$ where X is approximately 0 in transitional dielectric layer 207-1 and where Y is approximately 0 in transitional dielectric layer 207-N. The relative concentrations of M and Si are increased and decreased respectively as each successive transitional layer 207 is formed. For an embodiment in which high K dielectric 206 is $HfO_2$ (i.e., M is hafnium), transitional dielectric layer 207-1 would be primarily silicon-oxide with a small amount of hafnium while transitional dielectric layer 207-N would be primarily hafnium oxide with a small amount of silicon. In this manner, the composition of transitional dielectric film 205 transitions from a silicon-oxide-like composition to a hafnium-oxide-like composition.

In some embodiments that include nitrogen in transitional layers 207-1 through 207-N, the nitrogen concentration is relatively constant in each of the transistional layers 207-1 through 207-N. In other embodiments, however, the nitrogen concentration in transitional layers 207-1 through 207-N may vary from layer to layer. In this embodiment, the nitrogen concentration may increase with each successively formed transitional layers or decrease with each successively formed transitional layer. The nitrogen concentration may also be related to the metal element concentration. For example, the nitrogen concentration may either increase or decrease as the metal element concentration increases. In still another embodiment, the nitrogen concentration may be relatively high at the both extremes of the transitional dielectric film 205 (i.e., high nitrogen concentration near transitional dielectric layer 207-1 and 207-N) with a relatively low nitrogen concentration in the intermediate transitional dielectric layers.

Figure 4:
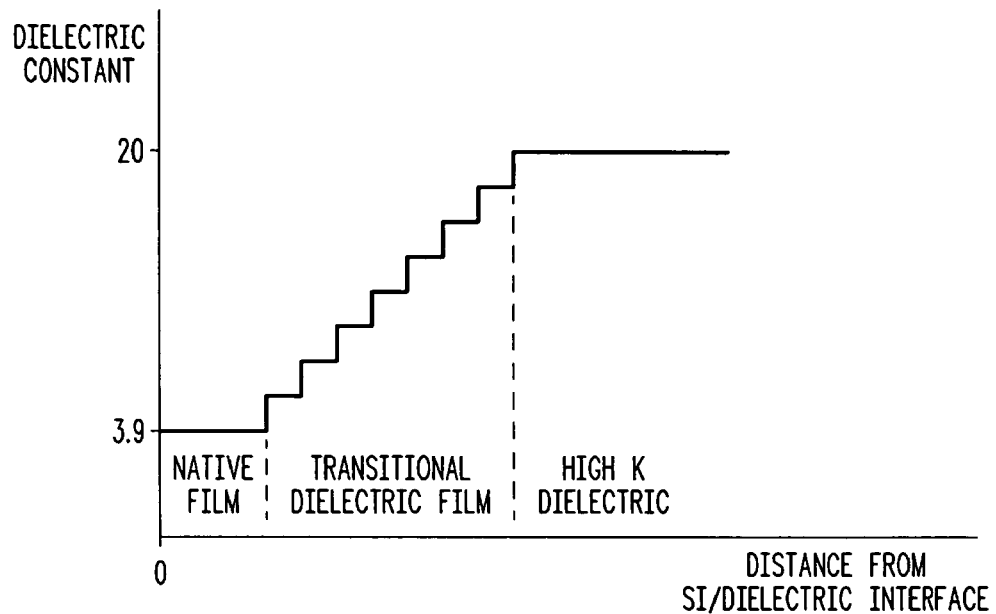
FIG. 4 is a graph illustrating the composition of the transitional dielectric layer of FIG. 2 according to an embodiment of the present invention.

Referring to FIG. 4, a graphical depiction of transitional dielectric film 205 is presented. In FIG. 4, the dielectric constant of the gate dielectric structure is plotted as a function of the distance from (above) the silicon substrate interface (i.e., the interface between silicon substrate 202 and residual oxide film 204). As shown in FIG. 4, the dielectric constant of the gate dielectric structure is approximately 3.9 (the dielectric constant of $SiO_2$) within the residual oxide film 204. The dielectric constant is approximately 20 within the high K dielectric film 206. In between, FIG. 4 shows the dielectric constant of the gate dielectric structure increasing from 3.9 to 20 in discreet increments. Each "step" in the transitional portion of the dielectric structure represents a corresponding layer 207-1 to 207-N in transitional dielectric film 205.

The implementation of transitional dielectric film 205 represented in FIG. 4 contemplates a series of discrete transitional dielectric layers 207-1 to 207-N formed overlying residual oxide film 204. In one embodiment of the invention, transitional dielectric layers 207-1 to 207-N are monolayer films (a film having a depth of one atomic layer). Monolayer film embodiments of transitional dielectric layers 207-1 to 207-N achieve the transition from silicon oxide to metal oxide with a desirably thin transitional dielectric film 205. It is desirable to constrain the thickness of transitional dielectric film 205 to maintain a thin effective oxide thickness. Because monolayer films represent the thinnest films that may be formed feasibly, the use of monolayer transitional films constrains the thickness of transitional dielectric film 205 while simultaneously enabling the use of multiple films and multiple film compositions. The use of multiple film compositions beneficially spread the potential drop across the dielectric structure thereby reducing the electric field (E-field) experienced by residual oxide film 204.

The embodiment described above encompasses dielectrics that may contain a metal element, a semiconductor element such as silicon, and oxygen. In another embodiment, transitional dielectric may also include nitrogen. In one implementation of a nitrogen embodiment, transitional dielectric 205 transitions from $M_{X1}Si_{Y1}O_{Z1}N_{W1}$ in transitional dielectric layer 207-1 to $M_{X2}Si_{Y2}O_{Z2}N_{W2}$ in transitional dielectric layer 207-N wherein the ratio X2:Y2 is greater than the ratio X1:Y1 (i.e., the concentration of the metal element M is greater in dielectric layer 207-N than in the dielectric layer 207-1). In a variation of this implementation, transitional dielectric layer 207-1 is an $SiO_2$ layer (i.e., X1=W1=0). In this variation, the concentration of nitrogen and the metal element would be increased for transitional dielectric layer 207-2 so that transitional dielectric film 205 would transition from SiO2 to MSiON (e.g., HfSiON) with a low metal concentration to MSiON with a high metal concentration. In a second implementation of the nitrogen embodiment, transitional dielectric 205 transitions from MON (e.g., HfON) with a low concentration of M to MON with a high concentration of M. In a variation of this embodiment, transitional dielectric layer 207-1 is either $SiO_2$ (no metal, no nitrogen) or SiON (no metal). The silicon concentration is decreased to 0, while the metal concentration is increased.

It should be noted that the specific concentrations of Si, O, N, and the metal element in each layer 207 is an implementation detail. The concept is to provide a transitional dielectric film that includes multiple discreet and possibly monoatomic layers where the composition of each subsequent layer differs from the composition of the prior layer. The transition is generally from an $SiO_2$ or SiON dielectric to a metal oxide or metal oxynitride dielectric.

Figure 5:
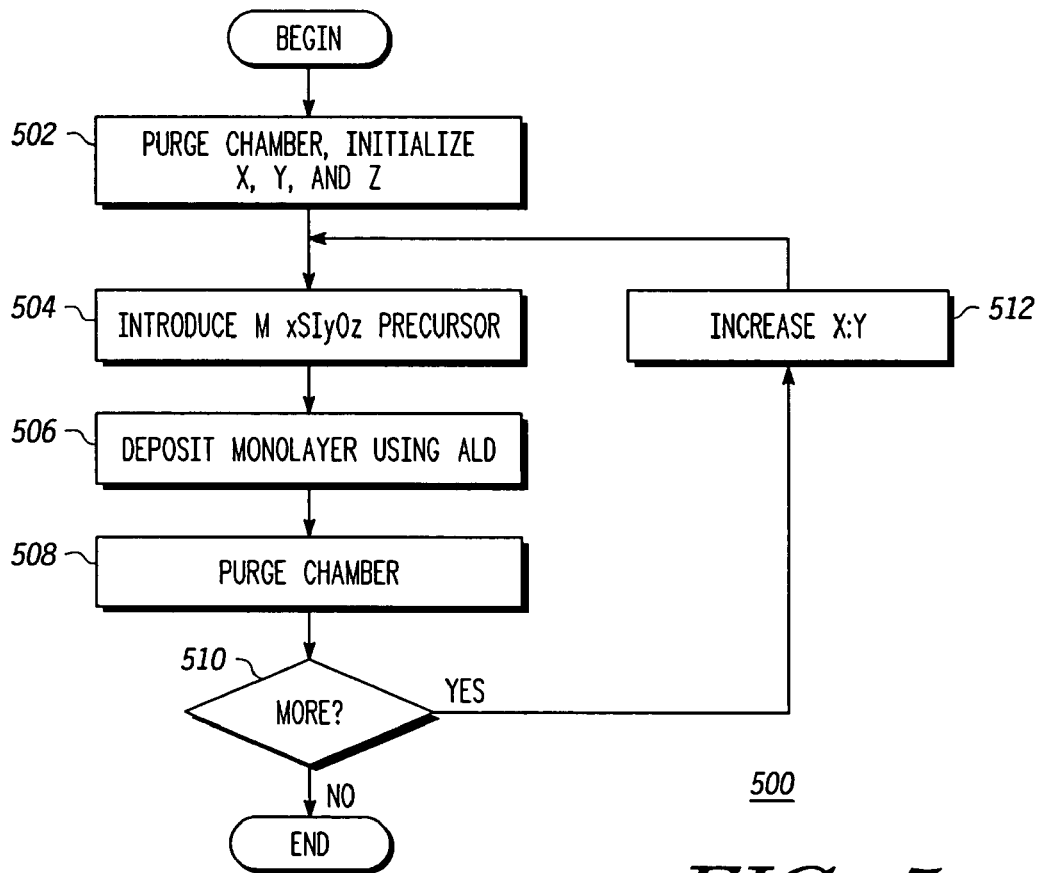
FIG. 5 is a flow diagram conceptually illustrating a method for forming the transitional dielectric layer according to an embodiment of the present invention.

Referring to FIG. 5, a flow diagram is presented to illustrate a method 500 of forming transitional dielectric film 205 according to one embodiment of the invention. In the preferred embodiment, method 500 employs an atomic layer deposition (ALD) apparatus capable of depositing monolayer films. ALD systems deposit films using controlled amounts of reactant in a self limiting process.

Method 500 as depicted in FIG. 5 includes initially purging an ALD reactor chamber and setting (block 502) values for variables X, Y, Z, and W where X, Y, Z, and W represent the relative concentrations of M (a metal such as hafnium), a semiconductor element such as silicon, oxygen, and nitrogen respectively. For an embodiment in which the composition of transitional dielectric layers 207 in proximity to residual oxide film 204 is close to the composition of residual oxide film 204, the value of X is low relative to Y (representing the concentration of silicon).

After X, Y, Z, and W are initialized, a controlled amount of a precursor is introduced (block 504) into the reactor chamber. The precursor components are controlled (according to the values of X, Y, Z, and W) to provide a precursor that will result in the deposition of a film having the desired composition of metal, silicon, oxygen, and nitrogen. One embodiment of the invention contemplates the use of a metal precursor component, a silicon or another semiconductor precursor component, nitrogen, and oxygen. The precursor components, oxygen, and nitrogen are introduced into the chamber in precisely controlled quantities to achieve the desired composition and to ensure that the deposition process consumes the available reactants after forming a monolayer film.

After the precursor is introduced into the chamber and appropriate environmental conditions (temperature, pressure, etc.) are established, a monoatomic transitional dielectric layer 207 of transitional dielectric film 205 is deposited (block 506). Other embodiments (not depicted) may elect to use two or more monolayers for a transitional dielectric layer 207, but minimizing the number of monolayers (i.e., the thickness) of any transitional dielectric layer 207 is desirable to minimize the effective oxide thickness of gate dielectric structure 201 as a whole.

Following deposition of a monolayer of transitional dielectric film 205, method 500 purges (block 508) the chamber and determines (block 510) whether additional monolayers are desirable. In one embodiment, transitional dielectric film 205 includes a specified number of transitional layers 207. In this embodiment, block 510 simply compares the number of monolayers already deposited to the specified number of layers. If additional layers are required, the values of X and Y are adjusted so that the X:Y ratio is increased. In the preferred embodiment, the number of monolayers within transitional dielectric layer 205 determines the amount by which the X:Y ratio is adjusted each cycle. If a relatively larger number of monolayers are used, smaller increments in X:Y ratio may be accommodated resulting in a less severe E-field gradient.

Method 500 completes when the number of deposited monolayers equals the specified number of monolayers. Exemplary embodiments may use as many as approximately 40 monolayers where each subsequent monolayer has an greater concentration of metal and a lesser concentration of silicon. Method 500 of forming transitional dielectric film 205 thus includes the formation of discreet layers using ALD and the precise control of precursors to vary the monolayer composition from layer to layer.

Although the depicted embodiment of method 500 adjusts the silicon and metal concentrations only in block 512, the concentrations of oxygen and/or nitrogen may also be adjusted in block 512. Moreover, the concentration of one or more of the dielectric components (i.e., silicon, nitrogen, oxygen, and the metal) may be 0 during a particular step. For example, embodiments of transition dielectric 205 that include an SiO2 layer or an SiON layer will have zero concentration of the metal element during the formation of the initial layer or layers 207. Similarly, while the silicon concentration may be non-zero during an initial step, it may be zero for the formation of subsequent layers.

In the foregoing specification, the invention has been described with reference to specific embodiments. However, one of ordinary skill in the art appreciates that various modifications and changes can be made without departing from the scope of the present invention as set forth in the claims below. For example, although the depicted embodiment describes a metal oxide high K dielectric, other high K dielectrics including metal silicates and metal nitrides may also be used. In addition, although the described embodiment implies that the metal element used in the transitional dielectric layers 207 is the same element as the metal element used in high K dielectric 206, other embodiments may use a first metal in the dielectric layers 207 and a second metal in the high K dielectric 206. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process for forming a gate dielectric structure overlying a semiconductor substrate, comprising:

forming a transitional dielectric film overlying the semiconductor substrate, wherein a composition of the transitional dielectric film proximal to the semiconductor substrate differs from a composition of an upper surface of the transitional dielectric film, wherein the composition of the transitional dielectric film proximately to the substrate primarily comprises silicon and oxygen or silicon, oxygen, and nitrogen and wherein the composition of the transitional dielectric film proximal to the upper surface primarily comprises a metal element and oxygen or a metal element, oxygen, and nitrogen; and forming a high dielectric constant film overlying an upper surface of the transitional dielectric film, wherein the high dielectric constant film comprises a metal element and oxygen and wherein forming the transitional dielectric film comprises forming a plurality of transitional dielectric layers, wherein the composition of each transitional dielectric layer includes a higher concentration of the metal element and a lower concentration of silicon than an underlying transitional dielectric layer.

2. The method of claim 1, wherein forming the plurality of transitional dielectric layers comprises forming a plurality of monolayers using atomic layer deposition.

3. The method of claim 2, wherein a composition of each successive monolayer differs from a composition of the preceding monolayer.

4. The method of claim 3, wherein the metal element is selected from the group consisting of hafnium, aluminum, tantalum, zirconium, and yttrium.

5. The method of claim 1, wherein forming the transitional dielectric layer comprises performing multiple cycles of an atomic layer deposition process wherein a precursor concentration for each cycle differs from the precursor of a preceding cycle.

6. The method of claim 5, wherein the precursor contains a metal element and a semiconductor element and wherein the relative concentration of metal to semiconductor element is increased for successive cycles of the atomic layer deposition process.

7. The method of claim 6, wherein the precursor includes nitrogen and further wherein the relative concentration varies within the transitional dielectric layer.

8. A method of fabricating a dielectric for use as a transistor gate dielectric in a semiconductor fabrication process, comprising:

forming a transitional dielectric film overlying a residual oxide film overlying a semiconductor substrate, wherein the transitional dielectric film includes a plurality of transitional dielectric layers, wherein a dielectric constant of a layer proximal to an upper portion of the transitional dielectric film is greater than a dielectric constant of a transitional dielectric layer proximal to an interface with residual oxide film, wherein the composition of the transitional dielectric film proximately to the substrate primarily comprises silicon and oxygen or silicon, oxygen, and nitrogen and wherein the composition of the transitional dielectric film proximal to the upper surface primarily comprises a metal element and oxygen or a metal element, oxygen, and nitrogen; and forming a high K dielectric overlying the transitional dielectric film, wherein a dielectric constant of the high K dielectric is greater than 3.9, wherein the high dielectric constant film comprises a metal element and oxygen and wherein forming the transitional dielectric film comprises forming a plurality of transitional dielectric layers, wherein the composition of each transitional dielectric layer includes a higher concentration of the metal element and a lower concentration of silicon than an underlying transitional dielectric layer.

9. The method of claim 8, wherein a dielectric constant of the high K dielectric is greater than approximately 20.

10. The method of claim 8, wherein the metal element is selected from the group consisting of hafnium, aluminum, tantalum, zirconium, and yttrium.

11. The method of claim 10, wherein the transitional dielectric layers are monoatomic layers formed using an atomic layer deposition process.

12. The method of claim 11, wherein the metal to silicon concentration increases in each successive layer.

* * * * *